(12) United States Patent
Kirk et al.

(10) Patent No.: US 9,831,819 B2
(45) Date of Patent: Nov. 28, 2017

(54) SOLAR TRACKING PANEL MOUNT

(71) Applicant: Kirk-Rudy, Inc., Woodstock, GA (US)

(72) Inventors: Harry V. Kirk, Acworth, GA (US);
Bryan Carbon, Woodstock, GA (US);
Wolfgang G. Fraint, Marietta, GA
(US); Michael Aiken, Canton, GA (US)

(73) Assignee: KIRK-RUDY, INC., Woodstock, GA (US)

( * ) Notice: Subject to any disclaimer, the term of this patent is extended or adjusted under 35 U.S.C. 154(b) by 0 days.

(21) Appl. No.: 15/079,751

(22) Filed: Mar. 24, 2016

(65) Prior Publication Data

US 2016/0285411 A1    Sep. 29, 2016

Related U.S. Application Data

(60) Provisional application No. 62/137,408, filed on Mar. 24, 2015.

(51) Int. Cl.
*H02S 20/32* (2014.01)
*F24J 2/38* (2014.01)
(Continued)

(52) U.S. Cl.
CPC ............... *H02S 20/32* (2014.12); *F24J 2/523* (2013.01); *F24J 2/5417* (2013.01); *F16M 11/04* (2013.01);
(Continued)

(58) Field of Classification Search
CPC ..... Y10T 403/32557; Y10T 403/32565; Y10T 403/32631; F24J 2/5417; F24J 2/523; F24J 2002/5472; F24J 2/38; F24J 2/542; F24J 2/54; F24J 2/12; Y02E 10/47; H02S 20/32; F16M 11/24; F16M 11/04; H01L 31/042
See application file for complete search history.

(56) References Cited

U.S. PATENT DOCUMENTS

| 300,539 A | 6/1884 | Warwick |
| 1,199,662 A | 9/1916 | Campbell |

(Continued)

FOREIGN PATENT DOCUMENTS

FR    779517    4/1935

OTHER PUBLICATIONS

PCT Search Report and Written Opinion dated Jun. 23, 2016 for PCT Application No. PCT/US16/23981, 9 pages.

*Primary Examiner* — Jeffrey T Barton
*Assistant Examiner* — Michael Y Sun
(74) *Attorney, Agent, or Firm* — Lee & Hayes, PLLC

(57) ABSTRACT

A rotating, pivoting mount for mounting a panel is disclosed. The mount can include a mounting block, a driveshaft, and a base. A socket in the mounting block can be mounted on a ball of the base to pivotally couple the panel to a structure. The ball can also include a cam profile, while the mounting block can include a complementary cam follower. As the mounting block rotates, therefore, the cam follower can follow a path set forth by the cam profile to tilt the mounting block about one axis as the mounting block rotates about a second axis. In this manner, the panel can be rotated and tilted—or moved about two axes—using a single motor. The use of a single motor can, in turn, reduce the cost and complexity of the system, while maintaining high efficiency for the panel (e.g., a solar panel) mounted thereon.

20 Claims, 14 Drawing Sheets

(51) Int. Cl.
*F24J 2/54* (2006.01)
*F24J 2/52* (2006.01)
*F24J 2/12* (2006.01)
*H01L 31/042* (2014.01)
*F16M 11/04* (2006.01)
*F16M 11/24* (2006.01)

(52) U.S. Cl.
CPC ............ *F16M 11/24* (2013.01); *F24J 2/12* (2013.01); *F24J 2/38* (2013.01); *F24J 2/54* (2013.01); *F24J 2/542* (2013.01); *F24J 2002/5472* (2013.01); *H01L 31/042* (2013.01); *Y02E 10/47* (2013.01); *Y10T 403/32557* (2015.01); *Y10T 403/32565* (2015.01); *Y10T 403/32631* (2015.01)

(56) References Cited

U.S. PATENT DOCUMENTS

| | | |
|---|---|---|
| 2,809,504 A | 10/1957 | Erish |
| 3,663,043 A | 5/1972 | Walton |
| 4,195,905 A | 4/1980 | Hansen |
| 4,277,132 A | 7/1981 | Hansen |
| 4,625,709 A | 12/1986 | Brandstatter |
| 4,804,220 A * | 2/1989 | Rosheim ............... B25J 9/104 294/111 |
| 4,977,488 A | 12/1990 | Spotts et al. |
| 5,465,946 A * | 11/1995 | Smith ............... B23Q 1/0027 248/288.51 |
| 5,600,124 A | 2/1997 | Berger |
| 5,632,823 A | 5/1997 | Sharan |
| 5,798,517 A | 8/1998 | Berger |
| 6,055,839 A * | 5/2000 | Hughson ............... B44B 5/0052 101/5 |
| 6,820,531 B1 * | 11/2004 | Cianciolo ............... F16M 11/14 89/41.02 |
| 7,252,084 B2 | 8/2007 | Pawlenko et al. |
| 8,720,874 B2 | 5/2014 | Tschida et al. |
| 2006/0117879 A1 | 6/2006 | Ganser |
| 2009/0199846 A1* | 8/2009 | Collins ............... F24J 2/405 126/601 |
| 2013/0240018 A1 | 9/2013 | Park et al. |
| 2014/0251308 A1 | 9/2014 | Wyle et al. |

* cited by examiner

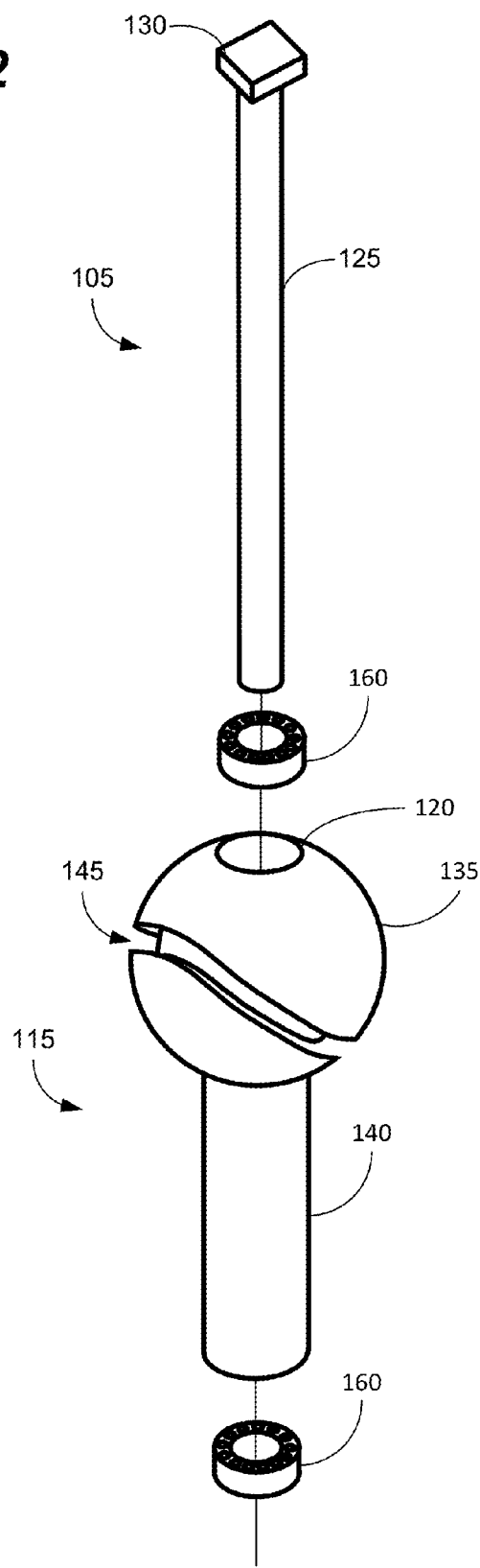

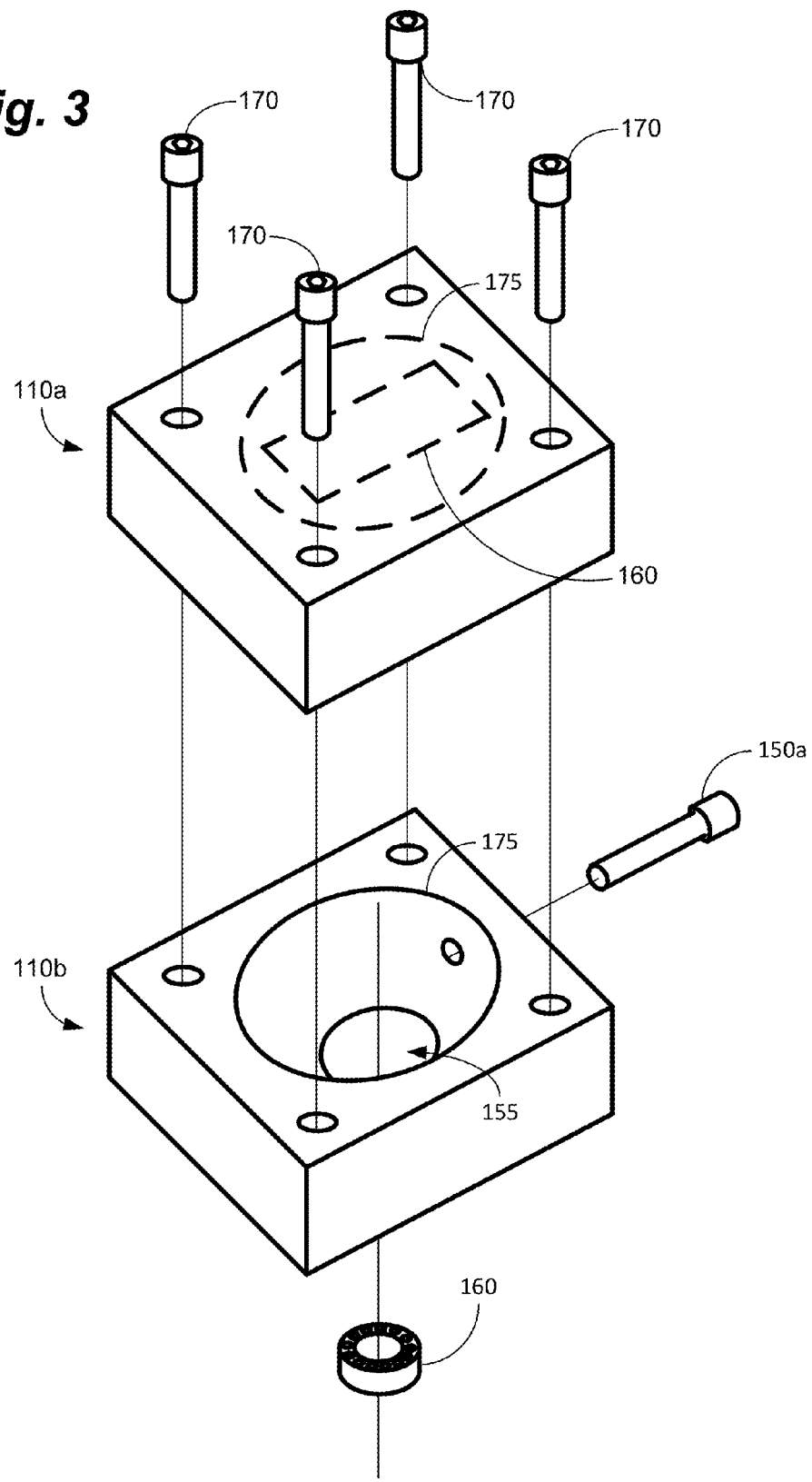

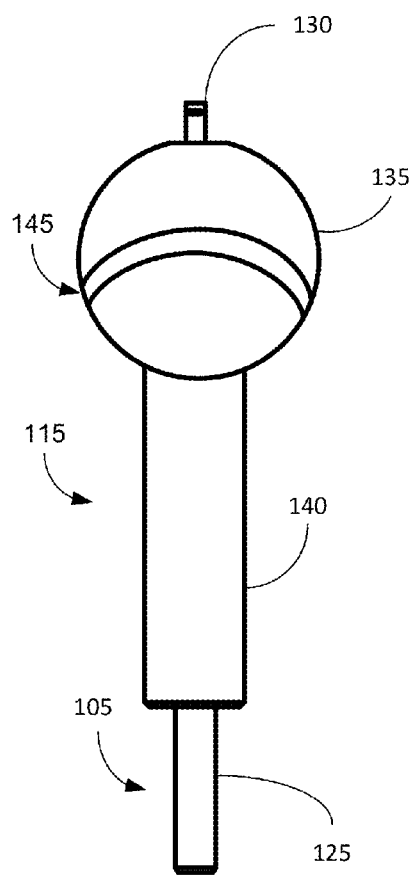 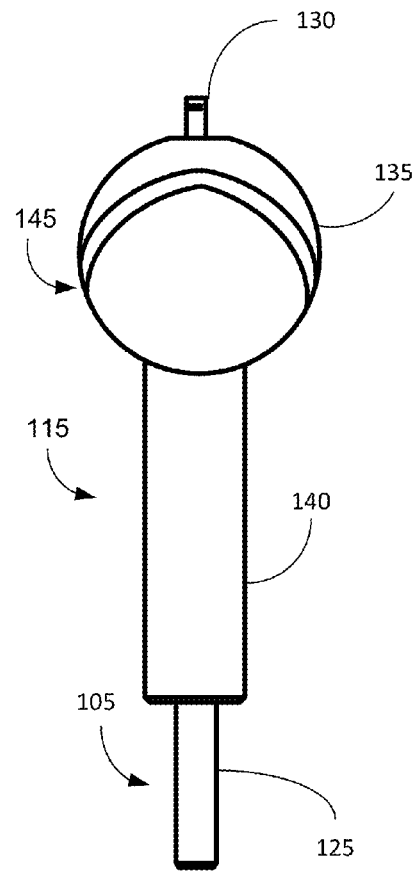
*Fig. 6A*  *Fig. 6B*

SOLAR TRACKING PANEL MOUNT

CROSS-REFERENCE TO RELATED APPLICATIONS AND PRIORITY CLAIM

This application is a non-provisional of, and claims priority under 35 U.S.C. §119(e) to, U.S. Provisional Patent Application No. 62/137,408, filed Mar. 24, 2015, of the same title. The provisional application is hereby incorporated by references as if fully set forth below.

BACKGROUND

1. Field of the Invention

Examples of the present disclosure relate generally to mounts for solar panels, and more specifically to mounts that enable the adjustment of solar panels about two axes—for tracking purposes—using a single motor.

2. Background of Related Art

A variety of solar trackers exist that attempt to adjust solar panels during the day and/or over the course of the year to increase solar collection efficiency. The efficiency of a solar panel is directly related to the angle of incidence of sunlight on the panel. In other words, the more directly the sunlight impinges on the solar panel, the higher the percentage of energy contained in the sunlight that can be recovered.

Rotating a solar panel about a single axis to follow the sun as it moves from east to west during the day can improve efficiency as much as 30%. Because the earth is tilted on its axis, however, adding a second axis to the tracker can increase efficiency by approximately another 6%.[1] Unfortunately, the addition of a second axis generally requires at least the addition of a second drive system (e.g., a motor and transmission) and controller. In a large solar array, this can significantly increase both the initial cost and the operating costs due to increased capital costs, maintenance costs, and other factors.

[1] Gay, C. F., et al., "Performance advantages of two-axis tracking for large flat-plate photovoltaic energy systems", Conf. Rec. IEEE Photovoltaic Spec. Conf., 16: 1368 (1982); King, D. L., et al., "Analysis of factors influencing the annual energy production of photovoltaic systems", Photovoltaic Specialists Conference, Conference Record of the Twenty-Ninth IEEE, 1356-1361 (May 2002).

What is needed, therefore, is a solar tracking system that enables tracking through at least two axes of motion, yet requires only one drive and/or control system. The system should be robust, simple, and relatively inexpensive to manufacture. It is to such a system that examples of the present disclosure are primarily directed.

SUMMARY

Embodiments of the present disclosure relate to a system for mounting panels, or other items, such that they both rotate and tilt. The system enables movement about two axes, while requiring only one power source—e.g., one motor and/or transmission—and one controller. The system can comprise a mounting block with a cam follower. The system can also comprise a mounting ball with a cam profile. As the mounting block is rotated about the first axis of the mounting ball, therefore, the cam follower also tilts the mounting block (and thus, the panel mounted thereon) about a second axis.

The system can enable a solar panel, for example, to be rotated and tilted to follow the motion of the sun in the sky. The system can improve the efficiency of systems, such a solar panels or antennas, by maintaining proper tracking. The system can enable a solar panel, or other attachment, to be rotated and tilted, while requiring only a single motor and/or transmission (or, "drive").

BRIEF SUMMARY OF THE DRAWINGS

FIG. 2 depicts a driveshaft and mounting ball for use with the system disclosed in FIGS. 1A-1C, in accordance with some examples of the present disclosure.

FIG. 3 depicts a mounting block for the system disclosed in FIG. 1A, in accordance with some examples of the present disclosure.

FIGS. 6A and 6B depict mounting balls with different cam profiles for different applications, seasons, or locations, in accordance with some examples of the present disclosure.

DETAILED DESCRIPTION

Embodiments of the present disclosure relate to systems and apparatuses for mounting panels, such as solar panels. The mount can enable the panels to be rotated (about a first axis) and tilted (about a second axis) using a single drive system. As a result, the system can operate with a single electric motor and/or transmission reducing complexity and cost. The system can be used, for example, to mount solar panels to enable the panels to be adjusted as the sun moves across the sky. The system can also be used to mount satellite or other antennas to track moving satellites, celestial bodies, aircraft, or other objects moving relative to the ground.

To simplify and clarify explanation, the disclosure is described herein as a system and method for mounting and moving solar panels for use in solar energy installations. One skilled in the art will recognize, however, that the disclosure is not so limited. While, the system may be described as a system for solar panels, it should be understood that the system can just as easily be used to mount and adjust other panels, such as solar hot water heaters, satellite, TV, and radio antennas, and other tracking installations.

The manufacturing methods, materials, and systems described hereinafter as making up the various elements of the present disclosure are intended to be illustrative and not restrictive. Many suitable materials, bearings, and configurations that would perform the same or a similar function as the systems described herein are intended to be embraced within the scope of the disclosure. Such other systems and methods not described herein can include, but are not limited to, vehicles, systems, networks, and technologies that are developed after the time of the development of the disclosure.

Figure 1A:
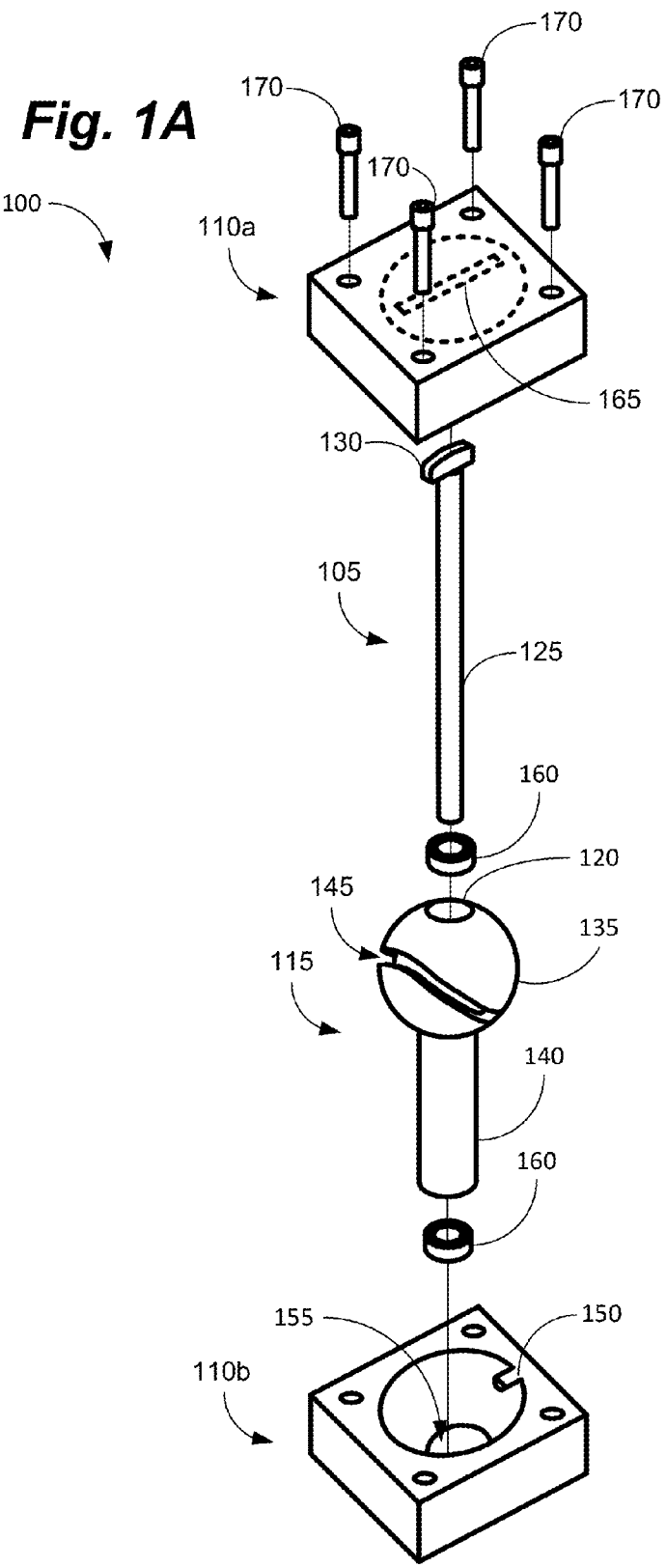
FIG. 1A is an exploded view of a system for mounting objects and moving the object about two axes using a single power source with a vertical two piece mounting block, in accordance with some examples of the present disclosure.

As shown in FIG. 1A, examples of the present disclosure can comprise system 100 for mounting, rotating, and tilting a panel, such as a solar panel or antenna. The system 100 can comprise, for example, a driveshaft 105, a mounting block 110, and base 115. As shown, in some examples, the driveshaft 105 and base 115 can be disposed in a coaxial, or concentric, manner such that the driveshaft 105 is disposed through a driveshaft hole 120 in the base 115.

In some examples, the driveshaft 105 can further comprise a shaft portion 125 and a drive key 130. In some examples, the shaft portion 125 can be substantially cylindrical, as shown. In other examples, the shaft portion 125 can be other suitable shapes such as, for example and not limitation, square, hexagonal, or octagonal. In some examples, the shaft portion 125 can be disposed in a substantially coaxial manner to the base 115 to enable the shaft portion 125 to rotate within the base 115.

In some examples, the drive key 130 portion of the driveshaft 105 can comprise a substantially flat drive tab, as shown. The tab can engage a complementary drive slot 165 on the mounting block 110. In other examples, the drive key 130 can have a hexagonal, star (e.g., Torx), square drive, Phillips-head, or other shape suitable for engaging with a complementary drive slot 165 in the mounting block 110, as discussed below.

In some examples, the shaft portion 125 can be mounted in one or more bearings 160 to reduce friction and increase stability, among other things. In some examples, the shaft portion 125 can be mounted in plain bearings comprising, for example, steel, brass, plastic, composite, or aluminum. In other examples, as shown, the shaft portion 125 can be mounted in roller or needle bearings.

The base 115 can comprise a ball 135 and mounting shaft 140. In some examples, the mounting shaft 140 can be detachably coupled to the ball 135 with a suitable fastener, such that the mounting shaft 140 is substantially fixed with respect to the ball 135, but removable. In this manner, the ball 135 and mounting shaft 140 can be replaced separately (e.g., due to wear on one component or the other). In other examples, the mounting shaft 140 can be welded, adhered, or otherwise permanently affixed to the ball 135. In still other examples, the mounting shaft 140 and the ball 135 can be integral components (i.e., cast, forged, or machined from a single piece of material). In some examples, the ball 135 and/or mounting shaft 140 can be coated in a friction reducing and/or wear resistant coating (e.g., Teflon®).

The ball 135 can define a cam profile 145 and the mounting block 110 can comprise a complementary cam follower 150. In some examples, as shown in FIG. 1A, the cam follower 150 can be integral to the mounting block 110. In other examples, as shown in FIG. 3, the cam follower 150 can be a separate component from the mounting block 110 and can be threaded, pressed, or otherwise affixed to the mounting block 110 (e.g. a bolt, roll pin, or dowel). In some examples, as shown, a first portion of the cam follower 150 can be disposed in an upper portion of the mounting block 110a and a second portion can be disposed in a lower portion of the mounting block 110b.

Of course, in some examples, the geometries could be different. In other words, in some examples, the cam profile 145 could be disposed on the inner surface of the mounting block 110 and a cam follower 150 could protrude from the base 115. In still other examples, the base 115 can comprise a raised cam profile 145 on the ball portion 135 and a cam follower slot 150 on the mounting block 110.

Regardless, the cam profile 145 can comprise a slot designed to produce the desired pattern of tilt for a panel mounted on the mounting block 110 as the panel rotates. The cam profile 145 can be different depending on the type of panel, the installation location, and/or the location of the system 100, among other things. In some examples, the cam profile 145 can be designed for a particular longitude and latitude, position, and/or location, for example. In other examples, the cam profile 145 can be designed to track the movement of the sun or a satellite, for example.

The cam profile 145 can be different, for example, for solar panels located in the southern United States, as opposed to those located in the northern United States (or the southern vs. northern hemisphere). The cam profile 145 can be different, for example, for satellite TV antennas located in the southern United States, as opposed to those located in the northern United States. In other words, the satellite may be located in a fixed geosynchronous orbit, requiring different aiming strategies depending on where in the U.S. the user is located.

Figure 1B:
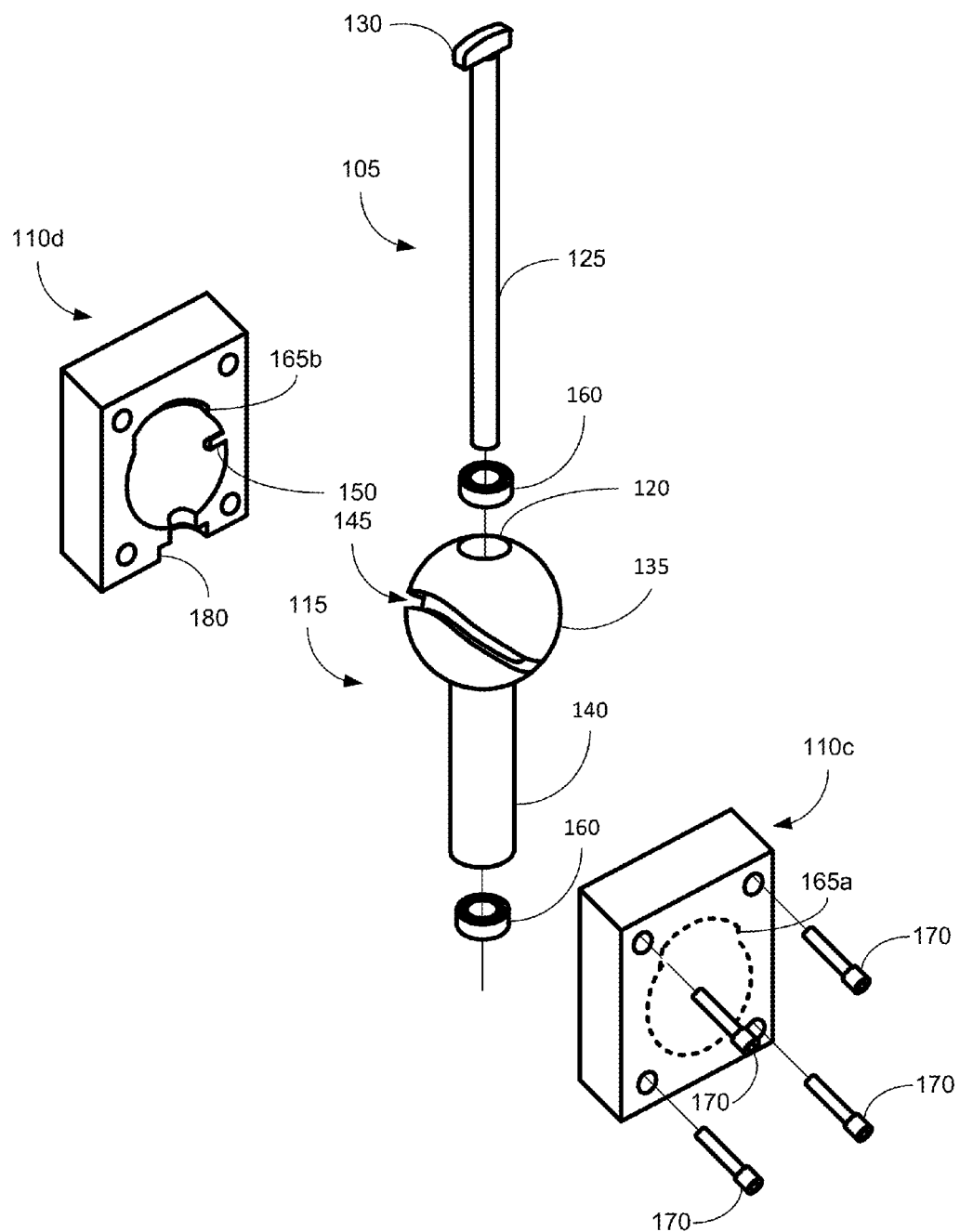
FIG. 1B is an exploded view of the system of FIG. 1, but with a horizontal two piece mounting block, in accordance with some examples of the present disclosure.

In some examples, as shown in FIG. 1B, other configurations for the mounting block 110 can be used. This may be to facilitate manufacturing or assembly, for example, or to accommodate a particular location or installation angle. In some examples, the configuration of the cam profile 145 and cam follower 150, for example, may require that the mounting block 110 be manufactured in multiple pieces. As shown, in some examples, the mounting block 110 can comprise a right portion 110c and a left portion 110d. In this configuration, a first portion 165a of the drive slot 165 can be located in the right portion 110c and a second portion 165b of the drive slot 165 can be location in the left portion 110d. Of course, though shown split along the centerline of the mounting block 110, the drive slot 165 could be differently oriented (e.g., perpendicular to the direction shown). Similarly, the right 110c and left 110d portions can comprise a bearing pocket 180 to house a driveshaft bearing or bushing 160, as necessary.

Figure 1C:
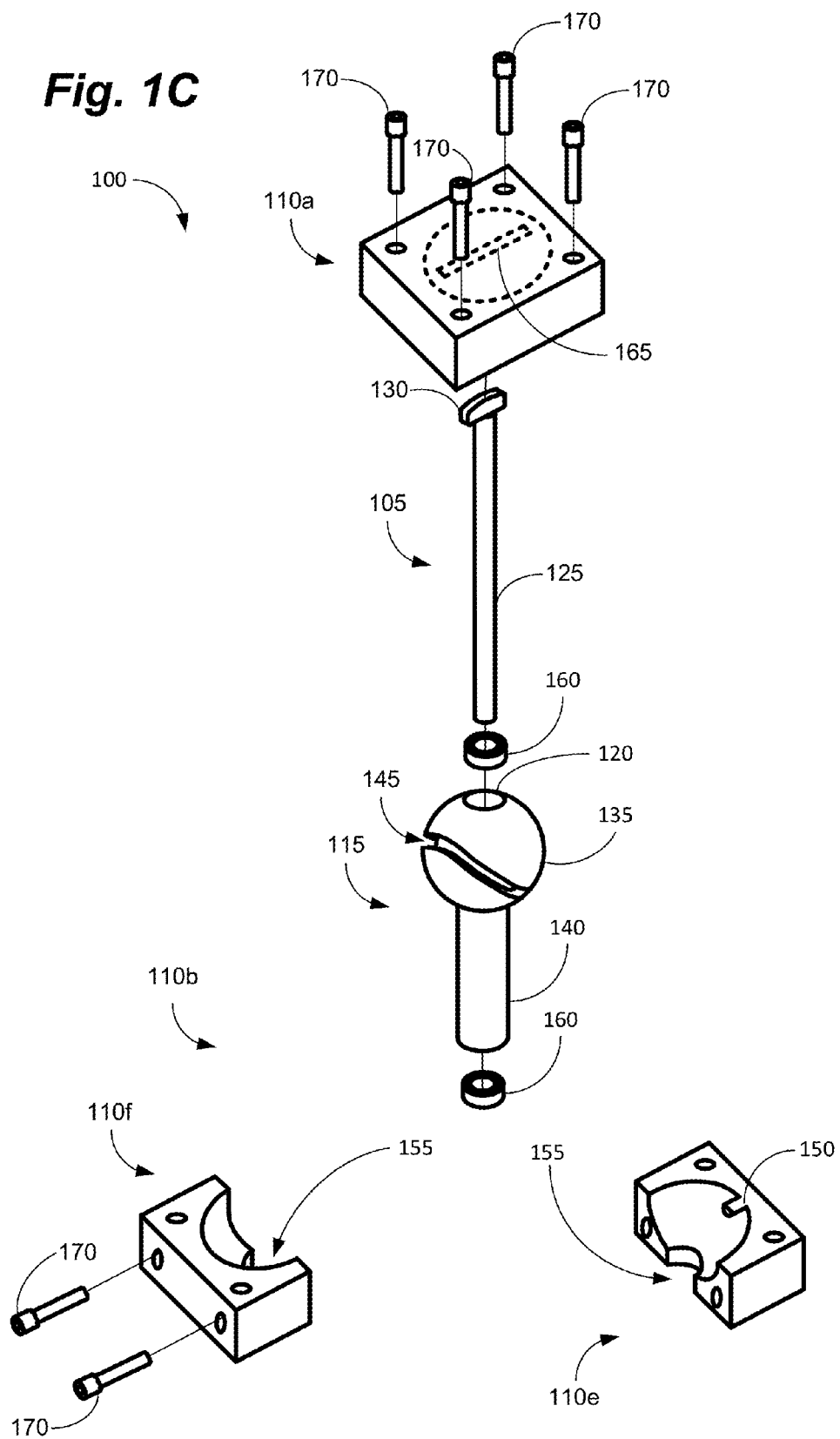
FIG. 1C is an exploded view of the system of FIG. 1, but with a three piece mounting block, in accordance with some examples of the present disclosure.

In still other examples, as shown in FIG. 1C, the mounting block 110 can be made up of additional components. In some examples, the lower portion 110b of the mounting block 110 can be made from right 110e and left 110f portions. Again, this may be to facilitate manufacturing or assembly, for example, or to accommodate a particular location or installation angle. Of course, the mounting block 110 can be manufactured in other configurations. The mounting block 110 can include, for example, right and left upper portion 110a with solid lower portion 110b. The mounting block can also comprise four or more pieces (e.g., separate right and left upper 110a and separate right and left lower 110b portions), or other configurations. Such configurations are contemplated herein.

As shown in FIG. 2, in some examples, the drive key 130 can comprise a cube 130a. In other examples, the drive key 130 can comprise other shapes such as a star shape, hexagon, 6- or 12-point socket, or other suitable shape. In some examples, the driveshaft 105 can be mounted in the base 115 using bearings 160. This can reduce the friction between the driveshaft 105 and the base 115, among other things. In other examples, such as for relatively slow movements, plain bearings, bushings, or no bearing/busing can be used. In some examples, the bearings 160 can be, for example, roller bearings, ball bearings, bushings, or sleeves. In some examples, the base 115 and/or mounting block 110 can further comprise grease fittings to enable the bearings 160 to be lubricated externally when the system 100 is fully, or partially, assembled. In other examples, the mating surfaces of the driveshaft 105, mounting block 110, and/or base 115 can comprise a non-stick, friction reducing, or wear resistant coating.

As shown in FIG. 3, in some examples, the mounting block 110 can comprise an upper portion 110*a* and a lower portion 110*b* and can be assembled using one or more fasteners 170. The fasteners can comprise, for example, bolts, screws, or pins to detachably couple the upper portion 110*a* of the mounting block 110 to the lower portion 110*b*. In other examples, the upper 110*a* and lower 110*b* portions of the mounting block 110 can be glued, welded, or otherwise permanently or semi-permanently joined during assembly of the system 100.

As shown, the upper 110*a* and lower portion 110*b* can each comprise a portion of a socket 175 that together form a complementary socket 175 for housing the ball 135 of the base 115. In this manner, the mounting block 110 can rotate and tilt in response to the cam profile 145 as the driveshaft 105 rotates the mounting block 110 about the base 115. In some examples, the socket 175 can comprise, for example, a nylon bushing, friction reducing coating, or other friction or wear reducing components.

The lower portion 110*b* can further define a mounting ball shaft hole 155 to enable the shaft portion 125 of the base 115 to be mounted therethrough. In some examples, the lower portion 110*b* can further comprise a bearing or bushing 160 disposed in the mounting ball shaft hole 155 to reduce friction and/or increase rigidity. In some examples, the bearing 160 can be press or slip fit onto the mounting shaft 140 or into the lower portion 110*b* of the mounting block 110.

Referring back to FIG. 1, in some examples, the cam follower 150 can be integrally cast or machined into the upper 110*a* and/or lower 110*b* portions of the mounting block 110. In this manner, the cam follower 150 can be inserted into the cam profile 145 as the mounting block 110 is assembled. In other examples, as shown in FIG. 3, the cam follower 150 can comprise a roll pin, bolt 150*a*, or other suitable element inserted into the mounting block 110. In this manner, the cam follower 150 can be inserted after the driveshaft 105, mounting block 110, and base 115 have been assembled. In some examples, the cam follower 150 can be removable to facilitate disassembly and maintenance.

Figure 4C:
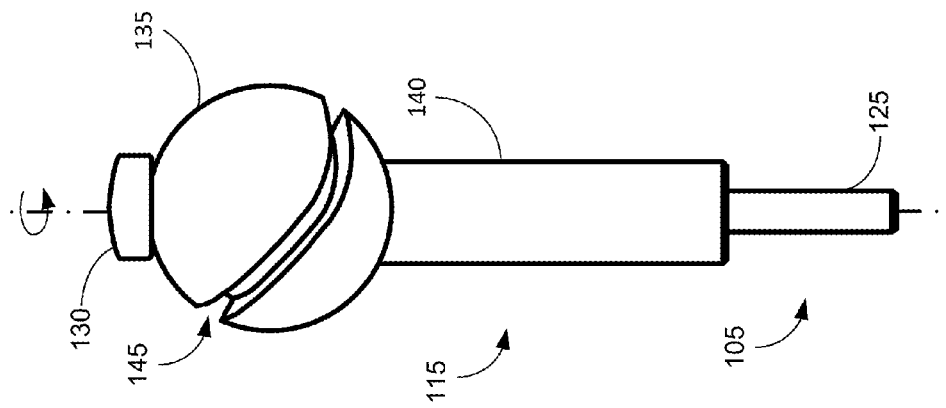
FIGS. 4A-4C depict different views of the driveshaft and mounting ball for the system disclosed in FIGS. 1A-1C, in accordance with some examples of the present disclosure.
Figure 4B:
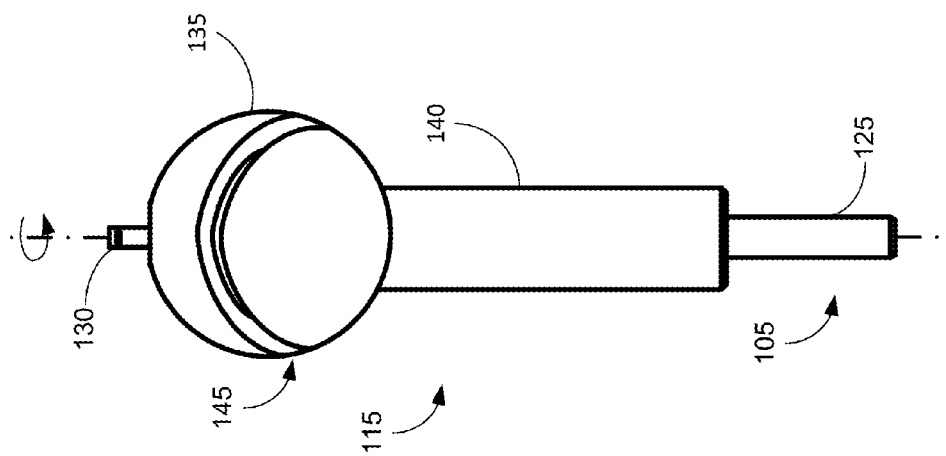
Figure 4A:
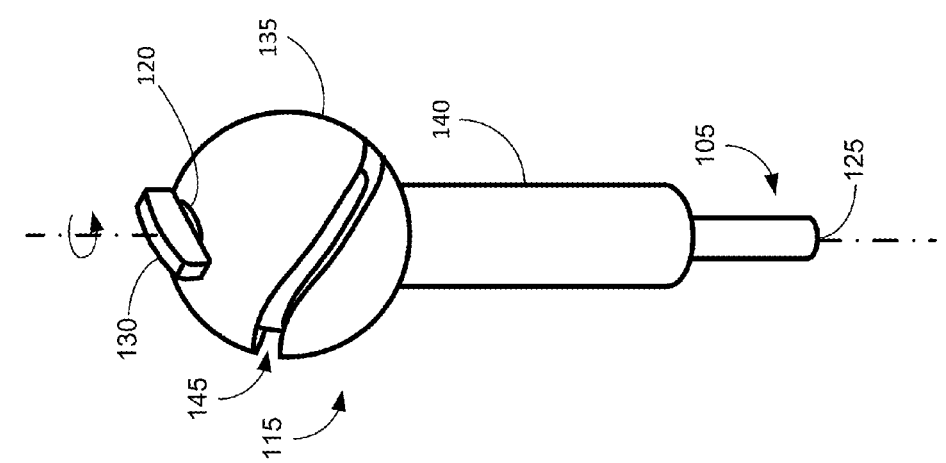

As shown in FIGS. 4A-4C, the driveshaft 105, via the drive key 130, can rotate a panel, antenna, or other apparatus mounted to the mounting block 110. The base 115 can be mounted in a fixed position on the mounting surface (e.g., a roof, flag pole, or mounting rack). As the driveshaft 105 rotates the panel, therefore, the panel rotates and the cam profile 145 controls the tilt of the panel. In this manner, the system 100 can move the panel though two axes of motion—i.e., rotating the panel about the y-axis and tilting the panel about the z-axis—while using only one drive motor to rotate the driveshaft 105. This can reduce the complexity, weight, and cost of the system 100 reducing initial and maintenance costs and increasing reliability.

Figure 5B:
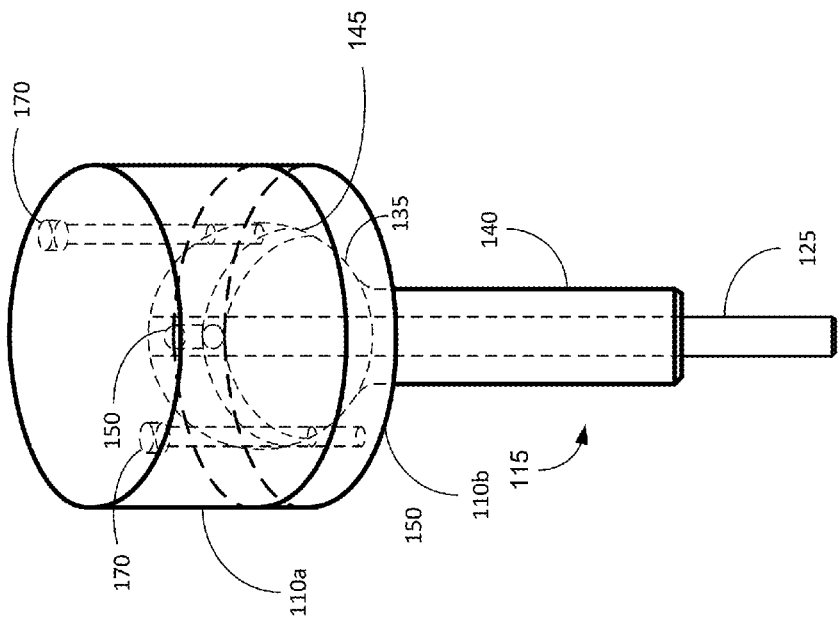
FIGS. 5A and 5B depict side and perspective detailed views of the system of claim 1, but with a round mounting block, respectively, in accordance with some examples of the present disclosure.
Figure 5A:
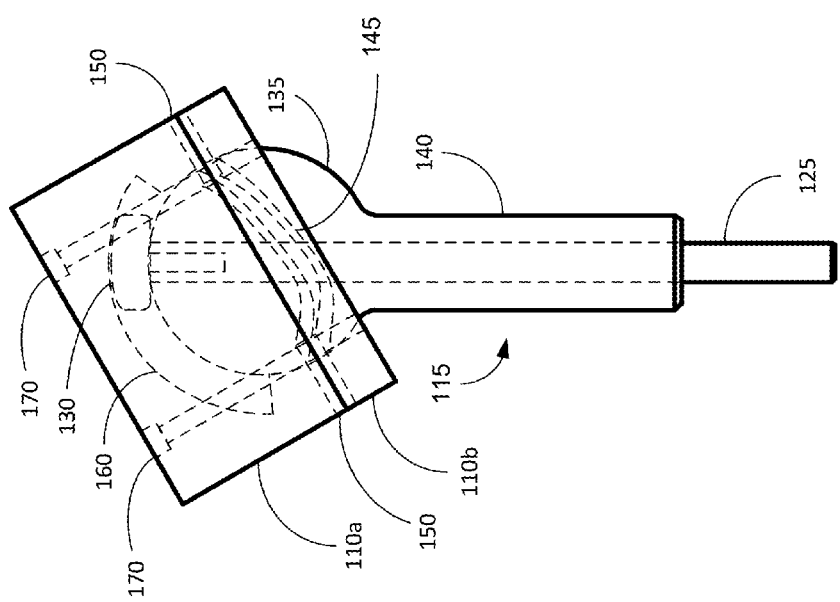

An example of the system 100 is shown in FIGS. 5A and 5B. Note that the mounting block 110 can be different shapes for different applications. The mounting block 110 is shown in FIG. 1 as rectangular or square, but can also be round (FIGS. 5A and 5B), or many other shapes, to suit different mounting locations, items to be mounted, or for aesthetic purposes, among other things. As shown, when assembled, the mounting block 110 can "sandwich" the ball 135 to essentially form a ball 135 and socket 175 joint with directed movement. In some examples, this can be done with the multi-piece mounting block 110, as shown. In other embodiments, the ball portion 135 of the base 115 could be sufficiently resilient to enable the mounting ball 135 to be temporarily deformed enough to be inserted into the socket 175.

Unlike a conventional ball and socket joint, which provides limited motion control, the interface formed by the mounting block 110 and ball 135 is guided by the interface between the cam profile 145 and the cam follower 150. In this manner, as the driveshaft 105 is rotated (and the base 115 remains stationary), the mounting block 110 both rotates with the driveshaft 105 and tilts according to the cam profile 145. To accommodate this tilting motion, in some examples, the drive slot 165 can be substantially arcuate, such that as the mounting block 110 tilts back and forth on the ball 135, the drive key 130 moves back and forth in the drive slot 165. This enables the mounting block 110 to tilt back and forth, yet enables the driveshaft 105 to provide rotational force to the mounting block 110 at the same time.

As shown in FIGS. 6A and 6B, the cam profile 145 can vary depending on, for example, the latitude, longitude, altitude, or mounting angle of the system 100. The cam profile 145 can also vary based on, for example, the path of the object to be tracked (e.g., the sun, a satellite, a radio, etc.). So, for example, solar panels mounted in more southerly locations (FIG. 6A) may require a shallower cam profile 145, while those mounted in a more northerly location may need a steeper cam profile 145 (FIG. 6B) to properly track the sun. Similarly, systems 100 for tracking satellite TV, for example, can have different cam profiles 145 based on their relative location to the satellite's orbit (e.g., based on the mounting location latitude and longitude). In addition, systems 100 for tracking satellites can have different cam profiles 145 than those for solar panels and can be different depending on whether the satellites are in polar orbit, low-earth orbit, eccentric orbit, geosynchronous orbit, etc.

Figure 6C:
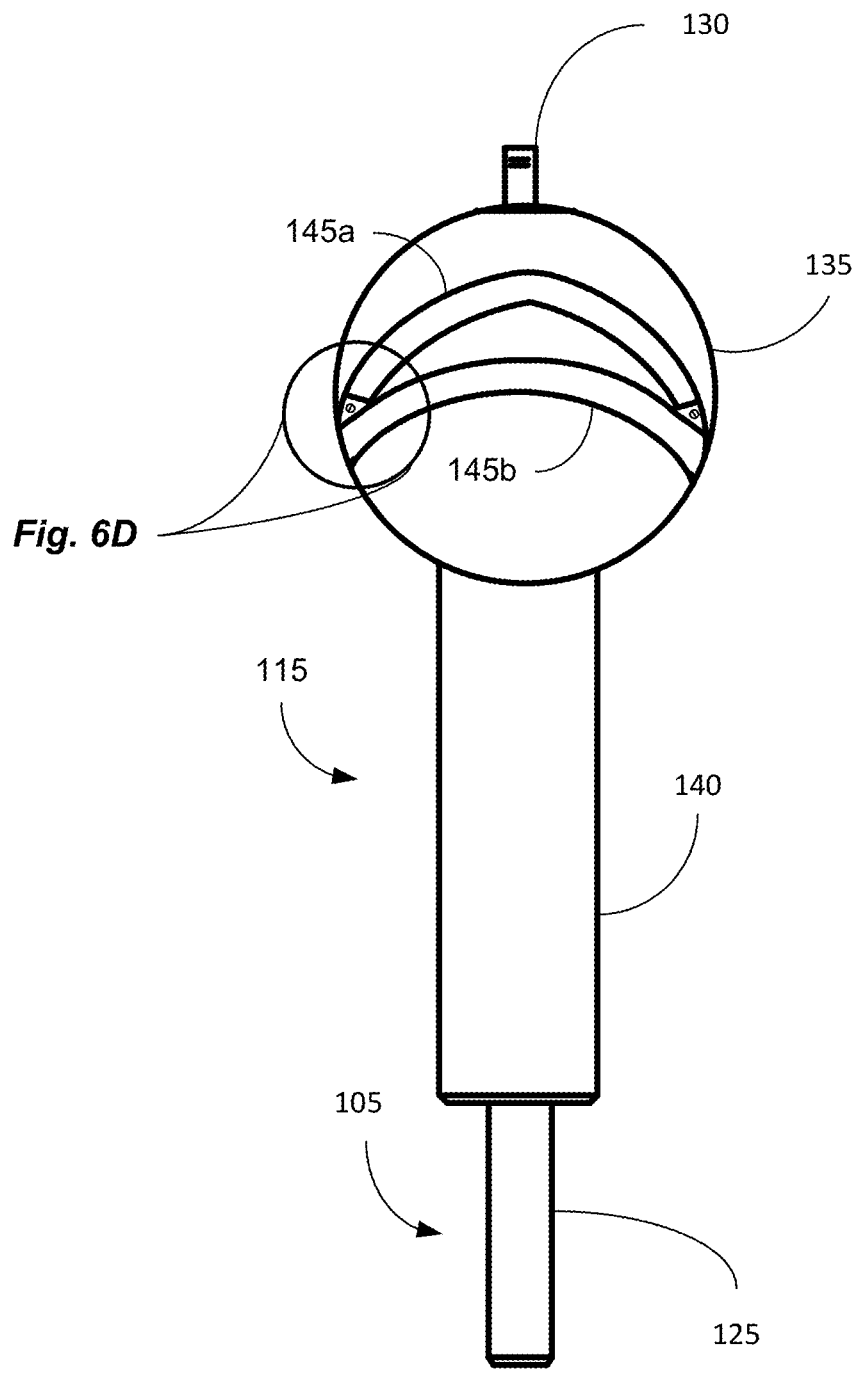
FIG. 6C depicts a mounting ball with two cam profiles for different applications, seasons, or locations on a single mounting ball, in accordance with some examples of the present disclosure.
Figure 6D:
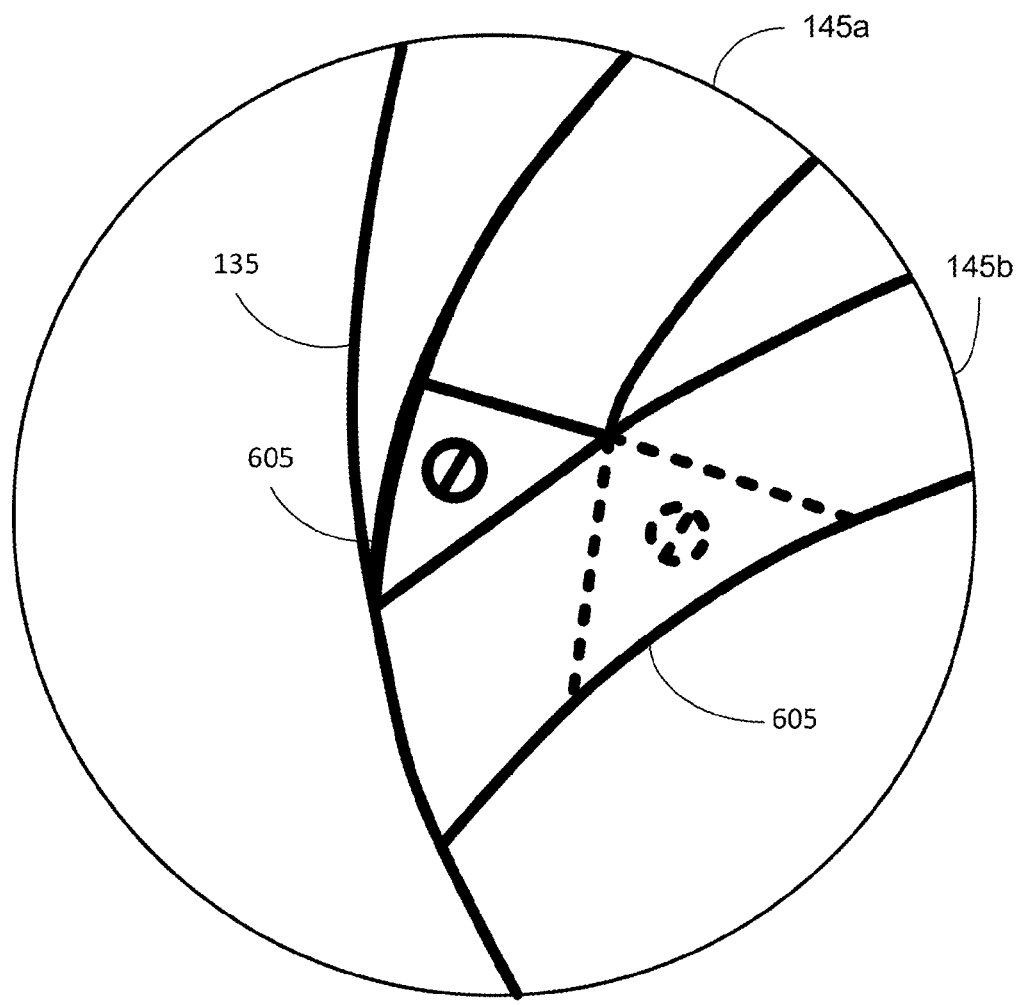
FIG. 6D depicts the mounting ball of FIG. 6C with block off plates to select a particular cam profile, in accordance with some examples of the present disclosure.

As shown in FIG. 6C, in some examples, the ball 135 can comprise multiple cam profiles 145*a*, 145*b*. The first cam profile 145*a* and the second cam profile 145*b* can include profiles for multiple states (e.g., different climates, seasons, mounting attitudes, applications, etc.). In some examples, the first cam profile 145*a* can be for spring and/or summer, for example, and the second cam profile 145*b* can be for fall and/or winter. Similarly, in some examples, the first cam profile 145*a* can be for horizontal mounting surfaces (e.g., a flat roof) and the second cam profile 145*b* can be for sloped mounted surfaces (e.g., for one or more common roof slopes). Multiple cam profiles 145*a*, 145*b* can enable the system 100 to be used in multiple states with limited, or no, modification. The system 100 can be mounted in multiple locations or used for multiple seasons, for example, while reducing the number of individual parts stocked by installers.

As shown in FIG. 6C, in some examples, the system 100 can comprise removable block off plates 605 to determine which of the two profiles 145*a*, 145*b* is used currently. In other words, block off plates 605 can be temporarily installed in one of the cam profiles 145a, 145b to prevent the cam follower 150 from entering that cam profile 145a, 145b. In this configuration, the block off plates 605 can be movable between the two cam profiles 145a, 145b depending on which profile is desired for a particular location or time of year, for example. As shown, the block off plates 605 can be detachably coupled to the ball 135 using screws, pins, or other suitable fasteners.

In other examples, the cam profiles 145a, 145b, can have different geometries and can be selected using different cam followers 150. In other words, the first cam profile 145a can be a different size or shape than the second cam profile 145b, so that a particular complementary cam follower 150 will only follow one cam profile 145a, 145b. In some examples, the first cam profile 145a could have a triangular cross-section, for example, while the second cam profile 145b could have a square profile. In other examples, the two cam profiles 145a, 145b could simply be different sizes such that a larger cam follower 150 will not fit into at least one of the cam profiles 145a, 145b. Of course, other methods could be used to select between the two profiles including, for example, a lock out solenoid or pin.

Figure 7:
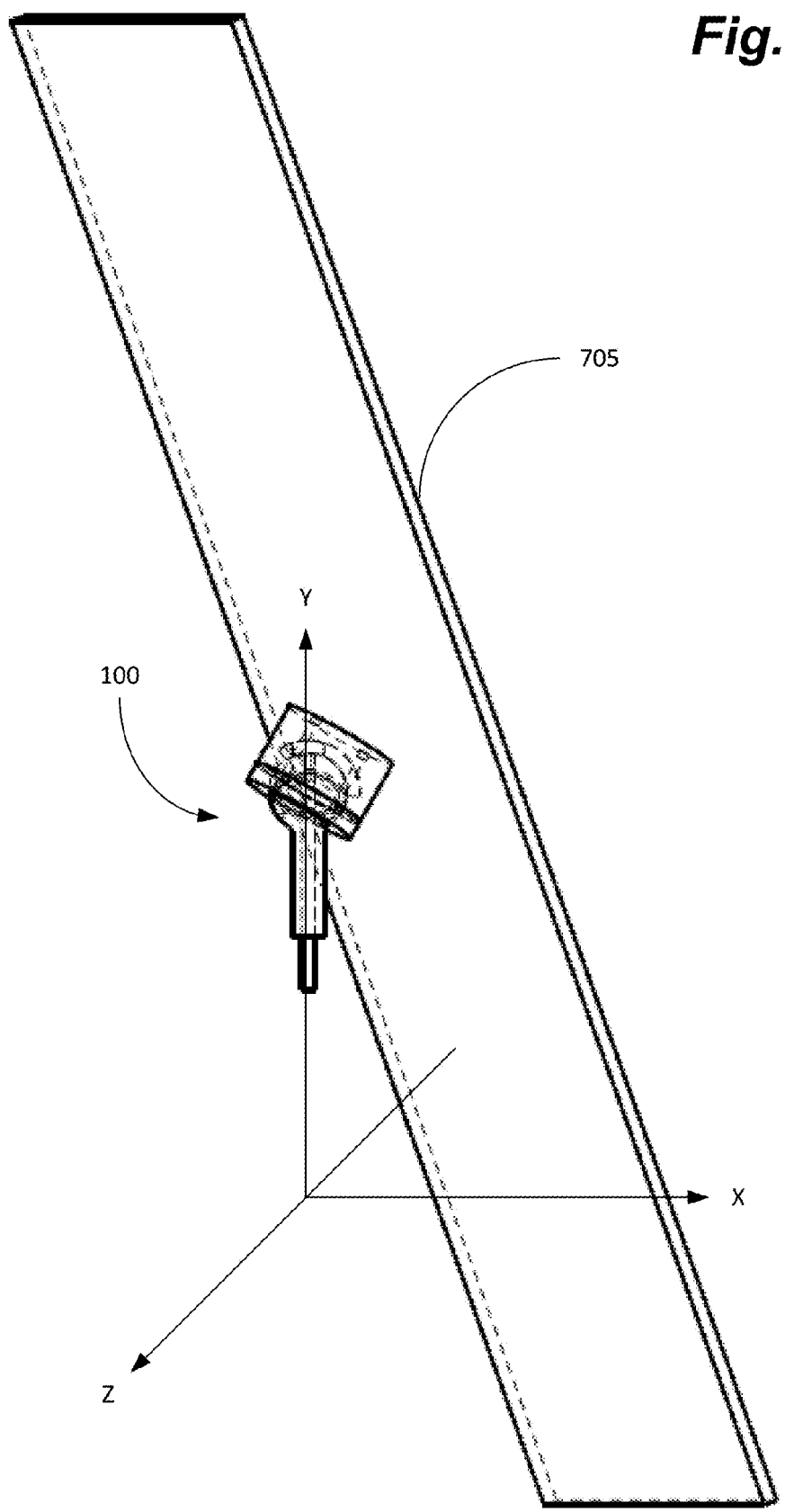
FIGS. 7-9 depict the system in morning, noon, and afternoon configurations, respectively, in accordance with some examples of the present disclosure.
Figure 8:
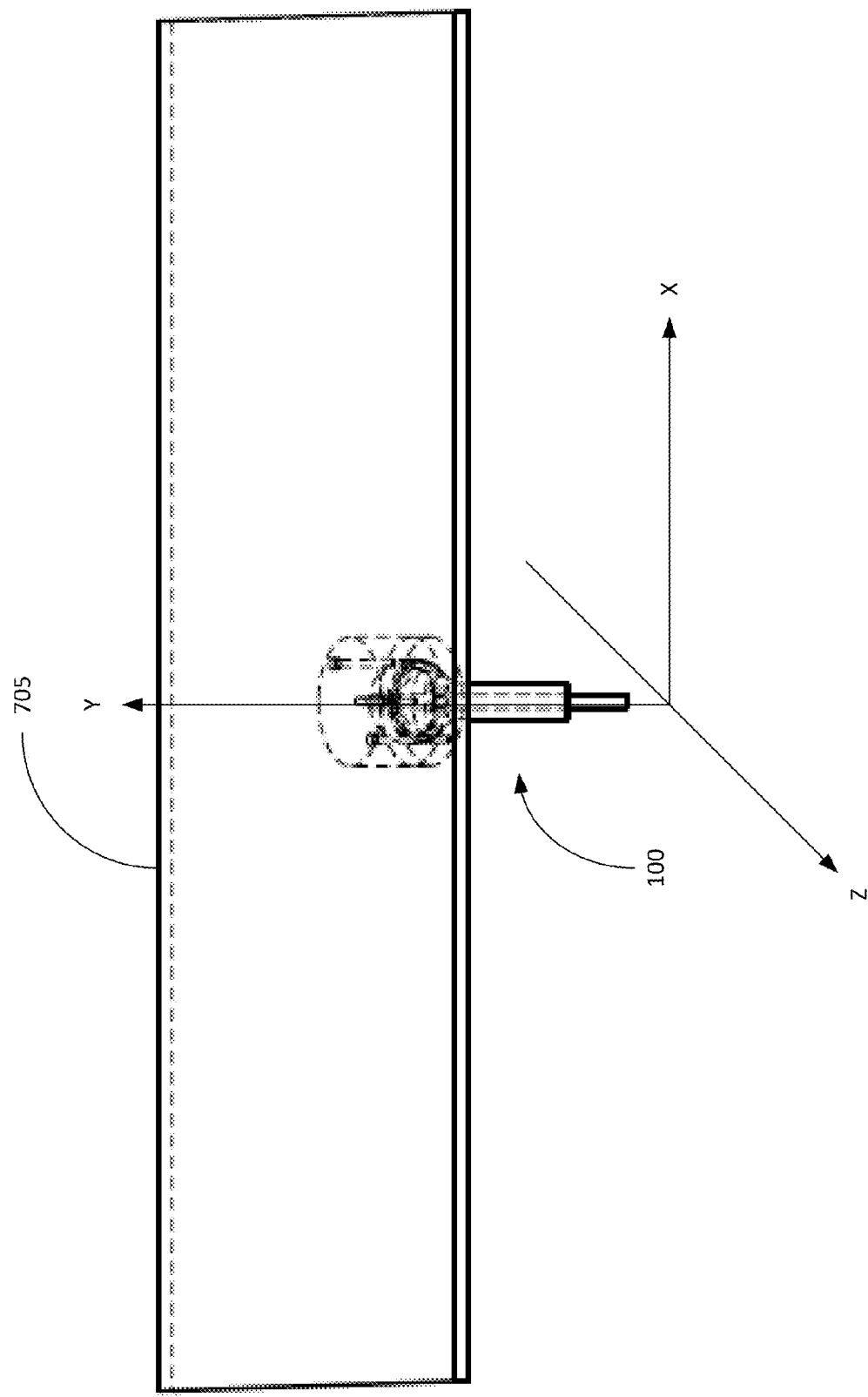
Figure 9:
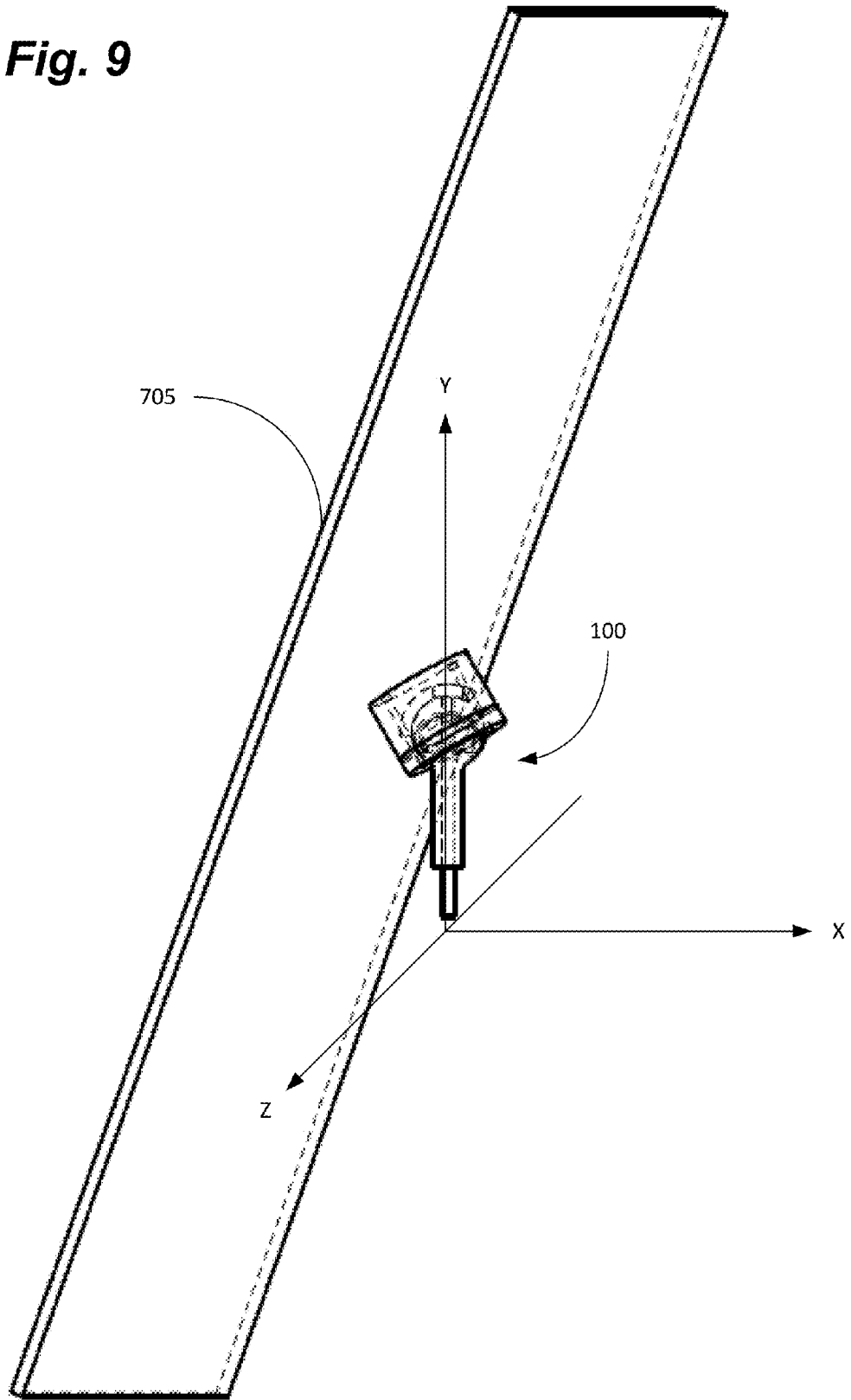

FIGS. 7-9 depict a solar panel 705 mounted to the system 700 in the morning position (FIG. 7), at noon (FIG. 8), and in the afternoon position (FIG. 9). As shown, the system 100 rotates the panel 705 about the y-axis and simultaneously tilts the panel 705 about the z-axis. In this manner, the position of the panel 705 can be optimized to improve solar energy collection. Thus, as shown, in the morning (FIG. 7) and afternoon (FIG. 9) positions, the panel 705 is angled toward the East and West, respectively, and is positioned at an acute angle to the ground to reduce the angle of incidence of the sunlight on the panel 705. Similarly, in the noon position (FIG. 8) when the sun is substantially overhead, the panel 705 continues to rotate about the y-axis, but is substantially parallel to the ground with respect to the z-axis.

Figure 10:
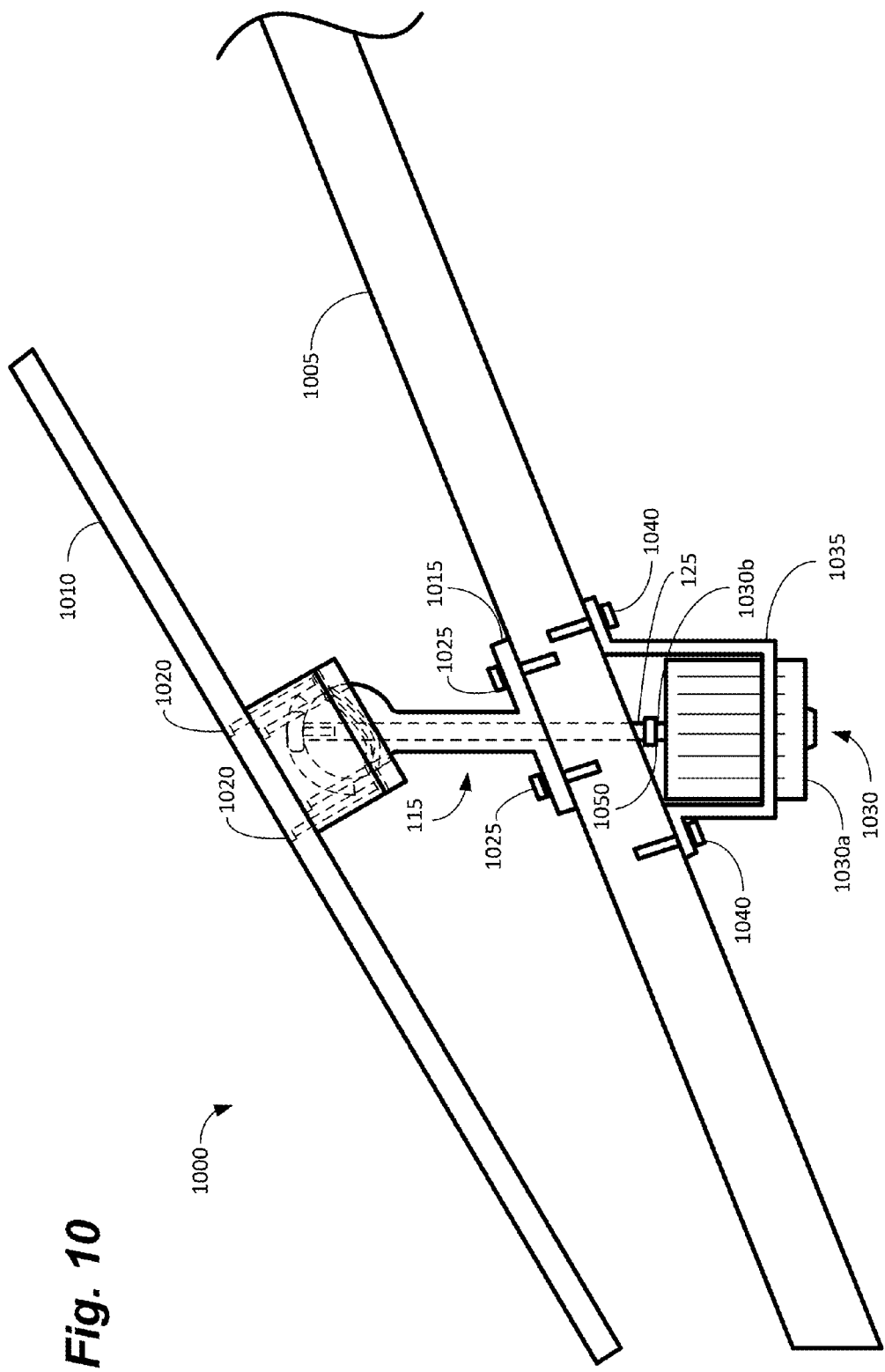
FIG. 10 depicts the system mounting a solar panel on a roof, in accordance with some examples of the present disclosure.

As shown in FIG. 10, the system 1000 can be installed on a roof 1005, for example, to improve efficiency for solar photovoltaic or hot water panels 1010. As shown, the panel 1010 can be mounted to the mounting block 110 using suitable fasteners 1020. The panel 1010 can be mounted, for example, using bolts, rivets, screws, or other suitable fasteners. In some examples, the mounting block 110 can be glued, welded, or otherwise affixed to the panel 1010 in a manner that does not require holes to be drilled in the panel 1010.

As shown, in some examples, the base 115 can comprise a mounting flange 1015 to enable it to be mounted to the mounting surface (e.g., the roof 1005 in this case) with one or more fasteners 1025. Of course, the base 115 can also be glued, welded, or otherwise affixed to the mounting surface depending on the mounting surface and location. In this manner, the base 115 can support the system 1000 and can also be prevented from rotating. Thus, as the driveshaft 105 rotates, the base 115 remains stationary The driveshaft 105, on the other hand, can be disposed in a concentric manner through the base 115 and can be attached to a rotary actuator 1030. In this manner, the driveshaft 105 can rotate within the base 115 and transmit rotary motion from the rotary actuator 1030 to the mounting block 110 via the drive key 130. The rotary actuator 1030 can comprise, for example, an electric, hydraulic, or pneumatic motor to provide rotary motion to the driveshaft 105. In some examples, the rotary actuator 1030 can comprise a stepper motor to enable the driveshaft 105 and thus, the panel 1010, to be moved in discrete increments. This can enable the panel 1010 to be accurately placed throughout the day. In other embodiments, the rotary actuator 1030 can comprise an electric motor and/or a transmission to transmit constant rotational motion to the driveshaft 105 at the appropriate rate. In some examples, such as when the panel 1010 comprises a solar panel, the rotary actuator 1030 can comprise an electric motor and can be powered directly or indirectly from the panel 1010, such that no external power source is required. This can further simplify installation of the system 1000.

In some examples, the rotary actuator 1030 can be fixed to the top or the bottom surface of the roof 1005 with a suitable bracket 1035 and one or more fasteners 1040. In this manner, the body 1030a of the rotary actuator 1030 and the base 115 can be substantially stationary with respect to the roof 1005, while the shaft 1030b of the rotary actuator 1030, via the driveshaft 105, can rotate and tilt the panel 1010 via the mounting block 110. As shown, the system 1000 enables a panel, such as a solar panel 1010 to be rotated and tilted using only one rotary actuator 1030. In some examples, the rotary actuator 1030 can be installed as shown, with the driveshaft 105 protruding through a hole in the mounting surface 1005. In other examples, the rotary actuator 1030 can be installed on the same side of the mounting surface 1005 as the system 1000 to limit penetrations in the mounting surface (e.g., to prevent roof leaks).

The rotary actuator 1030 can be coupled to the driveshaft 105 using a coupler 1050. The coupler 1050 can comprise a collar, for example, with one or more set screws to detachably couple the driveshaft 105 to the rotary actuator. In other examples, the coupler 1050 can be detachably coupled to one of the driveshaft 105 or the rotary actuator 1030 and can comprise a keyway or other means to engage the other of the driveshaft 105 or rotary actuator 1030. The coupler 1050 can comprise, for example, a slot, square drive, hex drive, or other means for engaging a complementary socket on the driveshaft 105 or rotary actuator 1030.

While several possible examples are disclosed above, examples of the present disclosure are not so limited. For instance, while a system for mounting solar panels and antenna is disclosed, other items could be mounted using the system without departing from the spirit of the disclosure. In addition, the location and configuration used for various features of examples of the present disclosure such as, for example, the shape and location of the mounting block, the length and size of the mounting ball, and the type of drive used can be varied according to a particular installation or item to be mounted that requires a slight variation due to, for example, size restrictions, construction covenants, wind and/or weather conditions, and/or weight or power constraints. Such changes are intended to be embraced within the scope of this disclosure.

The specific configurations, choice of materials, and the size and shape of various elements can be varied according to particular design specifications or constraints requiring a device, system, or method constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

What is claimed is:
1. A system comprising:
a mounting block defining a drive slot and a socket;

a base defining at least one cam profile, pivotally engaged with the socket of the mounting block;
a cam follower sized and shaped to follow the at least one cam profile; and
a driveshaft comprising a shaft and a drive key, the drive key providing rotational motion to the mounting block via the drive slot;
wherein the cam follower changes the tilt of the mounting block about the z-axis as the driveshaft rotates the mounting block around the y-axis.

2. The system of claim 1, wherein the base is mounted to a mounting surface for the system such that it does not rotate with respect to the mounting surface.

3. The system of claim 1, further comprising:
a rotary actuator, to provide rotary motion to the driveshaft, mounted to a mounting surface for the system;
wherein the rotary actuator is mounted to the mounting surface such that it does not rotate with respect to the mounting surface; and
wherein the driveshaft is coupled to the rotary actuator.

4. The system of claim 3, wherein the rotary actuator comprises an electric motor.

5. The system of claim 4, wherein the electric motor is a stepper motor.

6. The system of claim 1, wherein the drive slot is arcuate to enable the mounting block to tilt about the z-axis.

7. A system for mounting one or more panels comprising:
a mounting block, defining a drive slot and a socket, the mounting block comprising:
a first mounting block portion;
a second mounting block portion; and
a cam follower;
a base comprising:
a ball pivotally engageable with the socket of the mounting block and defining a first cam profile; and
a mounting shaft for fixedly mounting the system to a structure; and
a driveshaft comprising:
a shaft coupled to a rotary actuator to provide to rotational motion to the mounting block; and
a drive key slideably engaged with the drive slot;
wherein the cam follower changes the tilt of the mounting block about the z-axis as the driveshaft rotates the mounting block around the y-axis.

8. The system of claim 7, wherein the first mounting block portion comprises an upper mounting block portion; and
wherein the second mounting block portion comprises a lower mounting block portion.

9. The system of claim 8, wherein the lower mounting block portion further comprises:
a right portion; and
a left portion detachably coupled to the right portion.

10. The system of claim 7, wherein the first mounting block portion comprises a right mounting block portion; and
wherein the second mounting block portion comprises a left mounting block portion.

11. The system of claim 7, wherein the ball further defines a second cam profile;
wherein the first cam profile is configured for a first state; and
where the second cam profile is configured for a second state.

12. The system of claim 11, wherein the first state comprises a first season of the year; and
where the second state comprises a second, different season of the year.

13. The system of claim 11, wherein the first state comprises a first geographical location; and
where the second state comprises a second, different geographical location.

14. The system of claim 11, further comprising:
one or more block off plates detachably coupled to the base and disposed in the first cam profile to prevent the cam follower from following the first cam profile when the second cam profile is in use.

15. The system of claim 1, wherein the base defines:
a first cam profile comprising a first geometry; and
a second cam profile comprising a second geometry; and
wherein the cam follower comprises:
a first, interchangeable cam follower sized and shaped to follow the first cam profile; and
a second, interchangeable cam follower sized and shaped to follow the second cam profile.

16. The system of claim 7, further comprising:
a rotary actuator, to provide rotary motion to the driveshaft, mounted to a mounting surface for the system;
wherein the rotary actuator is mounted to the mounting surface such that it does not rotate with respect to the mounting surface; and
wherein the driveshaft is coupled to the rotary actuator.

17. The system of claim 16, wherein the rotary actuator comprises a stepper motor.

18. The system of claim 11, wherein the first state comprises a first mounting angle; and
where the second state comprises a second, different mounting angle.

19. The system of claim 11, further comprising a lock-out solenoid with a retracted position and an extended position;
wherein, in the retracted position, the cam follower follows one of the first cam profile or the second cam profile; and
wherein, in the extended position, the cam follower follows the other of the first cam profile or the second cam profile.

20. The system of claim 11, wherein the first state comprises a first roof pitch; and
where the second state comprises a second, different roof pitch.

* * * * *